United States Patent
Becker

(10) Patent No.: US 6,934,213 B2
(45) Date of Patent: Aug. 23, 2005

(54) METHOD AND APPARATUS FOR REDUCING WRITE POWER CONSUMPTION IN RANDOM ACCESS MEMORIES

(75) Inventor: Scott T. Becker, Darien, IL (US)

(73) Assignee: Artisan Components, Inc., Sunnyvale, CA (US)

( * ) Notice: Subject to any disclaimer, the term of this patent is extended or adjusted under 35 U.S.C. 154(b) by 0 days.

(21) Appl. No.: 10/460,626

(22) Filed: Jun. 11, 2003

(65) Prior Publication Data

US 2004/0252572 A1 Dec. 16, 2004

(51) Int. Cl.$^7$ .................................................. G11C 7/00
(52) U.S. Cl. ........................ 365/227; 365/145; 365/156
(58) Field of Search ................................. 365/227, 154, 365/156, 203

(56) References Cited

U.S. PATENT DOCUMENTS 4,669,062 A * 5/1987 Nakano ................. 365/189.01
5,808,950 A * 9/1998 Suzuki ........................ 365/203
6,512,685 B1 * 1/2003 Lien et al. ................... 365/227

* cited by examiner

Primary Examiner—Huan Hoang
(74) Attorney, Agent, or Firm—Martine Penilla & Gencarella, LLP

(57) ABSTRACT

A method and circuit for reducing power consumption during write operations in a RAM are disclosed. In A RAM comprised of a plurality of memory cells, the bit lines that are coupled to each memory cell in the RAM and used to read and write data into the cell are coupled through charge share control circuitry to a charge sharing line. During write operations, the bit line that will receive a zero value is coupled to the charge share line before data is written to the cell. The charge sharing line equalizes the charge on the selected bit line and the charge share line and reduces the voltage differential that must be swung to write data into the cell.

15 Claims, 4 Drawing Sheets

METHOD AND APPARATUS FOR REDUCING WRITE POWER CONSUMPTION IN RANDOM ACCESS MEMORIES

FIELD OF THE INVENTION

This invention relates generally to semiconductor memory devices. In particular it relates to write power reduction methods and circuits for use in semiconductor memory devices.

BACKGROUND OF THE INVENTION

Battery-powered portable electronic devices such as laptop computers, cell phones and personal digital assistants have become increasingly common of late. One major limitation of these devices is the amount of power they consume, which results in a fairly short operating life on a set of disposable batteries or on a single charge of a rechargeable battery. Although battery technology has improved recently, the most direct way to increase the amount of time that these devices can run on their batteries is to reduce the amount of power the devices consume.

Every portable electronic device has at least some semiconductor memory. Typically these devices have two types of semiconductor random access memory (RAM): static RAM (SRAM), which retains its contents as long as power is supplied; and dynamic RAM (DRAM), which loses its contents unless the data is refreshed on a regular basis. Reducing the power that RAM consumes can make an important contribution to reducing the overall power consumption of portable electronic devices.

RAM devices are generally array structures composed of 2N by 2M individual RAM cells that are coupled to wordlines (rows) and complementary bit lines (columns). A typical RAM memory cell may be composed of between 4 and 6 transistors coupled together to form a data storage device. An individual RAM memory cell may be selected when an X-decoder is used to select rows and a Y-decoder is used to select columns. Typically, data is written into an individual RAM cell when the proper address is selected and WRITE ENABLE circuitry allows digital data in the form of a differential voltage signal to be sent as input to the selected memory cell location. Once a specific memory cell is addressed within a RAM device and a READ ENABLE circuit is active, a very small voltage amplitude representing the addressed digital data is sensed. To produce a readable voltage amplitude representing useful digital data, a sense amplifier is typically implemented to amplify the sensed signal.

FIG. 1 is a block diagram of a conventional RAM wherein digital data is stored within RAM core 100. By way of example, if RAM core 100 is designed with 1,000 rows and 1,000 columns, RAM core 100 may be called a one megabit (1 MB) RAM storage device. In typical architectures, computers access RAM core 100 through an address input bus 110 that may be coupled to a conventional X-DECODER 102 and a conventional Y-DECODER 104. In general, X-DECODER 102 is used for addressing a selected row (wordline) within RAM core 100, and Y-DECODER 104 is used for addressing a selected column (bitlines) within RAM core 100. By way of example, X and Y decoders are generally implemented for reducing memory array aspect ratios by folding (i.e., dividing) long addressable memory columns into several shorter memory columns. Once folded into several columns, the X and Y decoders are capable of reading or writing the addressed data by appropriately performing a suitable multiplexing function.

Once a row and column is selected from RAM core 100, either a write or read operation may be performed on the selected RAM memory cell. In order to perform a write operation, a write control circuit 107 is enabled which allows digital data to be sent as input into a selected RAM memory cell via an input data bus 101. This digital data is in the form of a voltage waveform that represents either a logical "1" or a logical "0". Input buffer 109 amplifies an input signal 103 that is supplied by RAM input bus 111. The selected transistors in RAM core 100 are then driven to an appropriate state.

Once the row and column is selected in RAM core 100, a read operation may be performed which produces a voltage representing the addressed digital data on a data bus 112. At this point, the addressed digital data may be as low as about 50 millivolts (mV). To read the addressed digital data appropriately, suitable amplification is typically performed in sense amplifier 106. Once the sensed data signal is amplified to full rail voltage level (i.e., in earlier RAM devices, about 5V; in current RAM designs, 3.3V or less) in sense amplifier 106, the voltage amplified data is passed out as amplified data output 114 to an output buffer 108. At output buffer 108, the voltage amplified data 115 is current amplified to provide an appropriate level of current drive once the read data is passed to a RAM output bus 116.

Various techniques have been used to reduce active power consumption in SRAMs and DRAMs of the type illustrated in FIG. 1. These techniques include reducing the RAM operating voltage $(V_{dd})$, banking the memory cells that comprise the RAM memory and improving and optimizing clock signal distribution within the RAM memory.

Another known method called "virtual ground" has been used to reduce power consumption in RAMs. RAM banks are organized into rows and columns. The number of rows equals the number of words divided by a MUX factor and the number of columns equals the number of bits times the MUX factor. The MUX factor is used to control the aspect ratio of the RAM memory banks. For example, if the MUX factor is 4 and the number of bits equals 16 and the number of words equals 1024, then the number of rows equals 256 and the number of columns equals 64. This means that there are 64 physical memory columns attached to a word line across a row in the RAM memory. When the word line goes high, all 64 RAM core cells attached to that word line activate and begin drawing current. However, in this case only 16 of the 64 columns are required to read or write the correct data. The other 48 columns that are active are wasting power and performing no useful work. A virtual ground eliminates this wasted power. Each individual logic column in the RAM memory bank (words deep) is multiplied into MUXed physical columns and selected by a y-address combination, as shown in FIG. 2. The same y-address that selects which physical column will drive the sense amplifier enables a virtual ground line for that column (the virtual ground line is not illustrated in FIG. 2). All of the virtual grounds for the columns that are not selected are OFF and the columns do not draw current.

Typically, the largest contributor to active power consumption in RAM is writing data to the core memory cells that comprise the RAM. Herein the circuit elements that actually store data written to memory are called core cells. Writing to a RAM core cell usually involves holding one of the core cell's bit lines high $(V_{dd})$ and driving the other bit line to ground voltage. The power consumed by writing to the core cell can be defined as:

$P = C\Delta V^2 f$, where

P=the total power consumed when writing to the core cell;
C=capacitance of the bit lines and the core cell;
ΔV=the voltage differential between the bit line high and the bit line low; and
f=the clock frequency. Of these, the largest factor is the voltage differential on the bit lines.

One known method to reduce the bit line voltage differential is to use n-channel transistors as pre-charge and equalize devices. As shown in FIG. 3, known core cell 11 has two n-channel transistors 13, coupled respectively to bit line 12 and bit line complement 14. An additional n-channel device 15 is coupled so that its source is coupled to bit line 12 and its drain is coupled to bit line complement 14. The gates of n-channel devices 13 and 15 are all coupled together to a precharge voltage line. When core cell 11 is about to be accessed for writing, this technique charges both bit lines to approximately $V_{dd}-V_{tn}$, where $V_{tn}$ is the threshold voltage of the n-channel transistors. Typical values for $V_{tn}$ are from 400 mV to 600 mV. When $V_{dd}$ was at least approximately 2.5V, this technique was very effective. By equalizing the voltages on the bit lines, the voltage swing needed to write to the cell is reduced, no matter what value is written to the cell. As the needed voltage swing is reduced, the power used to write to the core cell is also reduced.

As process geometries continue to decrease and power supply voltages correspondingly reduce, SRAM core cell noise margins also reduce. This means that a $V_{dd}-V_{tn}$ voltage on the bit lines becomes closer to the trip point of the SRAM latch. As the precharge voltage on the bit lines approaches the trip point of the inverters that make up the latch of the core cell, data stability is compromised. In the illustrated core cell of FIG. 3, the access transistors begin to turn on at $V_{dd}-V_{tn}$. As the bit line voltages approach the turn-on voltage of the n-channel access device, this voltage is nearly equal to the precharge voltage when n-channel transistors are used as precharge transistors. With roughly the same voltage on both bit lines as the read cycle begins, the latches that comprise core cell 11 are at nearly their trip point and core cell 11 enters a meta-stable state where the value in the core cell can be corrupted. Under certain circumstances, when accessing a memory cell to read a value from it, a similar voltage imbalance can develop on the differential bit lines. This imbalance can result in the value in the memory cell flipping unpredictably, the resultant value actually written to the core cell potentially being incorrect. As using the precharge circuit of FIG. 3 to reduce power consumption in memory cells no longer produces reliable results, an alternative method must be found to reduce the voltage swing on the bit lines during write operations.

SUMMARY OF THE INVENTION

The present invention reduces power consumption in a core cell of a RAM during write operations by reducing the ΔV required to write to the core cells, without simultaneously reducing the read margin. A charge share line is addressably coupled to each core cell in a memory. When a value is written to the core cell, whichever bit line will receive a zero value is first coupled to the charge share line. Instead of the voltage differential on the zero bit line being $V_{DD}-0$, the differential is reduced to $V_{DD}-V_{Charge\ Line}$. The reduced voltage differential reduces the amount of power that must be used to swing the voltage on the zero value bit line, reducing the power consumption. During reading operations, the core cell couples to a ground potential, not the charge share line.

Other aspects and advantages of the present invention will become apparent from the following detailed description, taken in conjunction with the accompanying drawings, illustrating by way of example the principles of the invention.

BRIEF DESCRIPTION OF THE ILLUSTRATIONS

The present invention will be readily understood by the following detailed description in conjunction with the accompanying drawings, wherein like reference numerals designate like structural elements, and in which.

DETAILED DESCRIPTION OF THE PREFERRED EMBODIMENTS

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
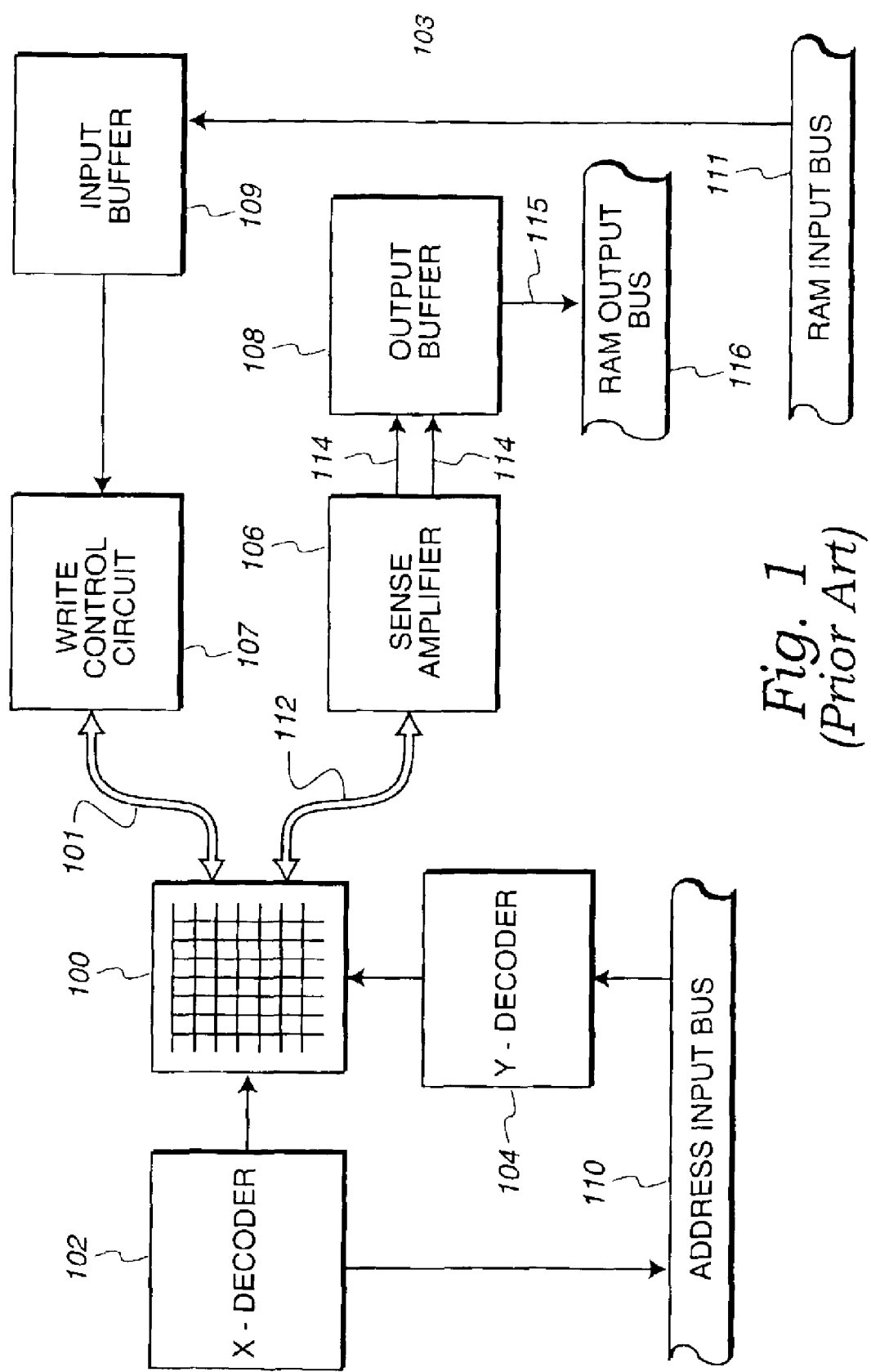
FIG. 1 is a block diagram of a RAM (Prior Art)
Figure 2:
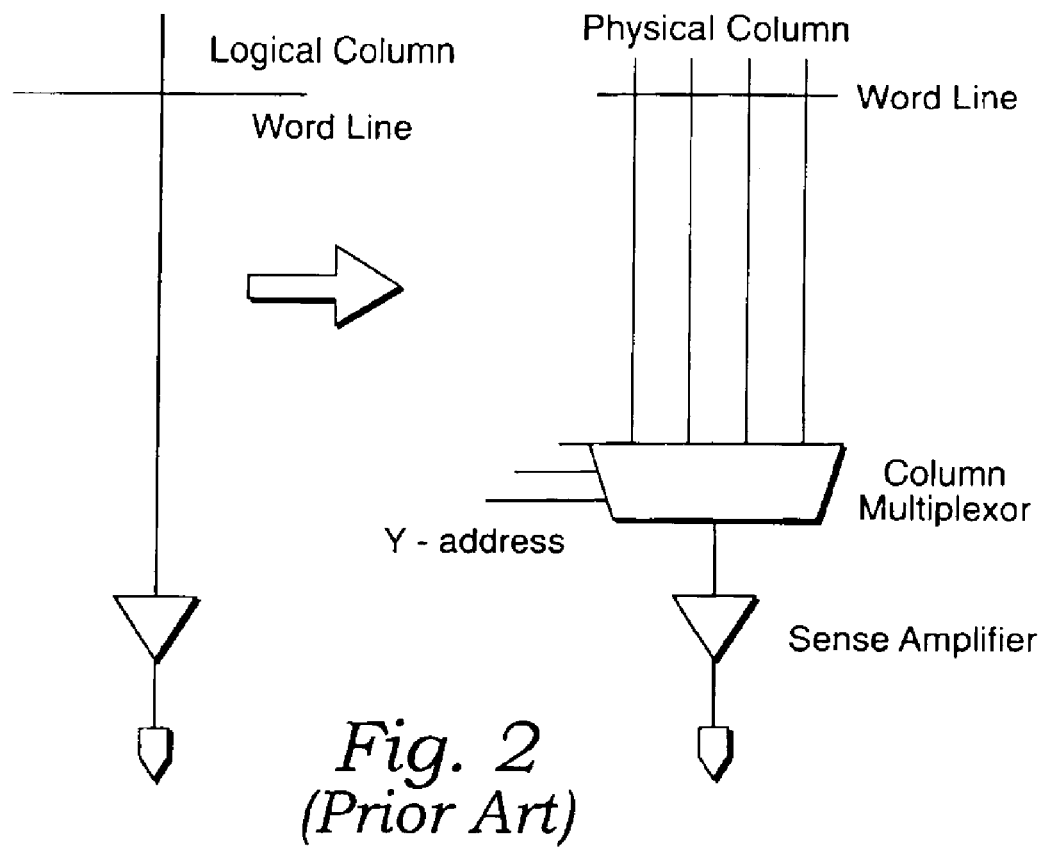
FIG. 2 is a detail of the RAM shown in FIG. 1, illustrating how one logical column may comprise a plurality of physical columns (Prior Art)
Figure 3:
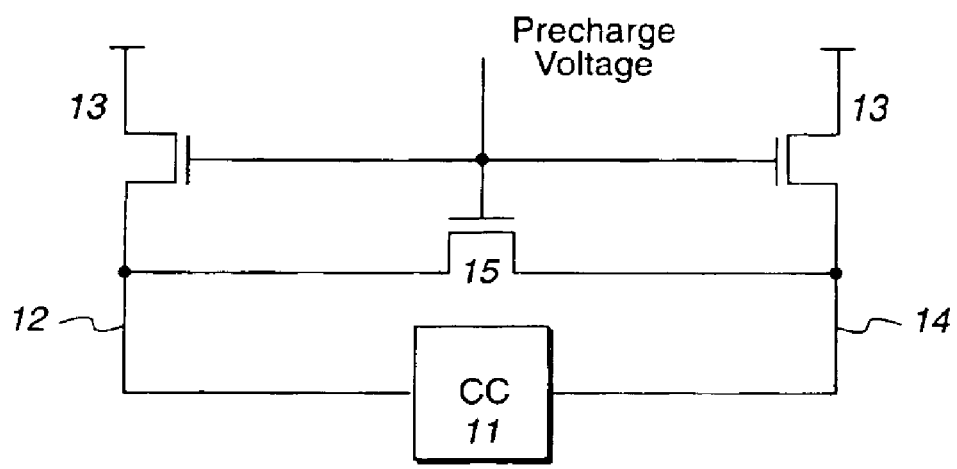
FIG. 3 is a schematic of a known precharge and equalize circuit for a core cell (Prior Art)
Figure 4:
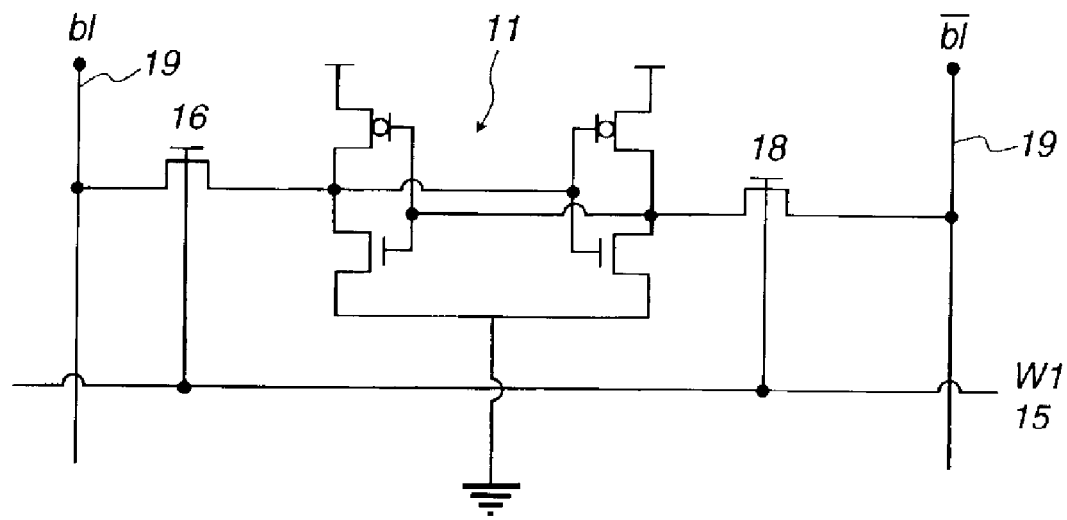
FIG. 4 is a schematic of a known core cell (Prior Art)

A known core cell 11 is shown in FIG. 4. Word line 15 is coupled to transistors 16 and 18. When core cell 11 is written to, both transistors 16 and 18 turn on, allowing the complementary signals on the respective bit line 17 and bit line bar 19 lines to be driven into the transistors that form the core cell. The core cell 11 shown in FIG. 4 is a conventional six transistor core cell, which essentially consists of two inverters whose outputs are applied to the inputs of the opposite inverter. The structure and operation of the core cell shown in FIG. 4 is known and requires no further description here.

Figure 5:
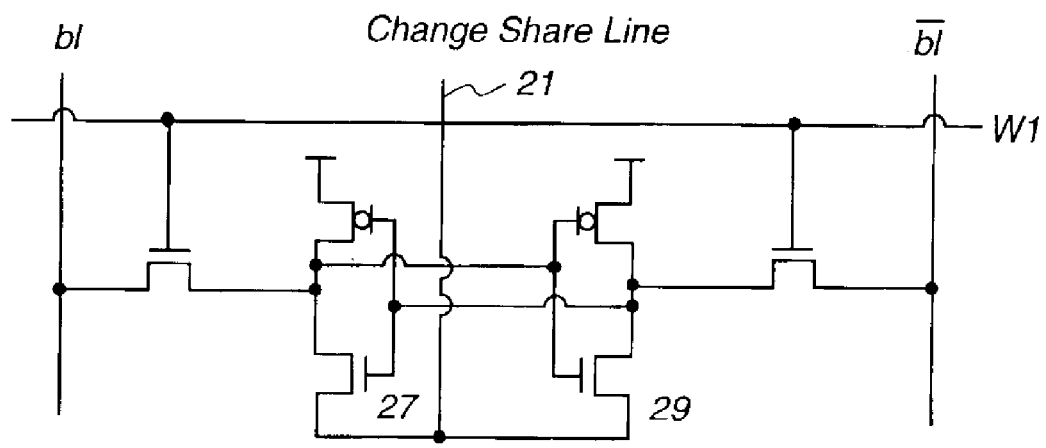
FIG. 5 is a schematic of a core cell constructed according to a first embodiment of the present invention.

A core cell that comprises a first embodiment of the present invention is shown in FIG. 5. A charge sharing line 21 is coupled to the drains of transistors 27 and 29, which form part of the six transistor core cell. In turn, charge share line 21 is coupled to ground through pull down control transistor 40 (see FIG. 6). The provision of a charge share line that can be alternatively coupled to either bit line or bit line bar, depending on the value being written to the core cell, comprises a first embodiment of the present invention.

Figure 6:
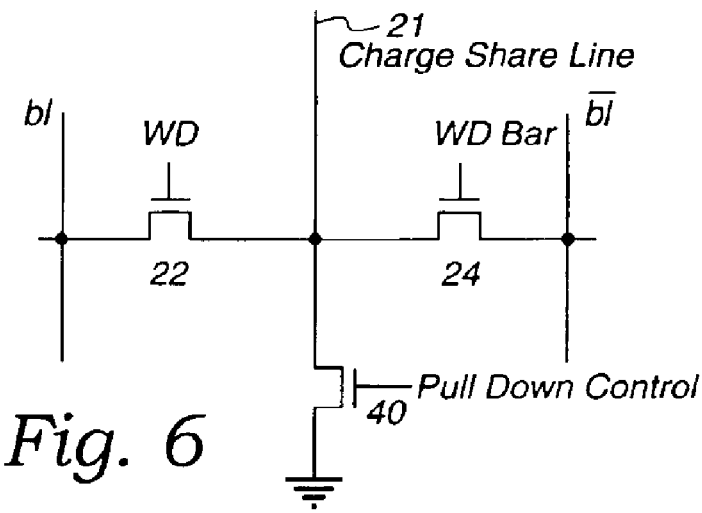
FIG. 6 is a schematic of the charge sharing write circuit according to an embodiment of the present invention.

A simple charge sharing write circuit is shown in FIG. 6. Transistor 22 has a source coupled to the bit line, a gate coupled to a write data line and a drain coupled to charge share line 21. Transistor 24 has a source coupled to the bit bar line, a gate coupled to the write bar data line and a drain coupled to charge share line 21. Transistor 40 has a source coupled to charge share line 21, a gate coupled to a pull down control circuit 30 (FIG. 7) and a drain coupled to ground. During a write operation to any individual core cell coupled to the charge share write circuit, either transistor 22 or transistor 24 is on. The pull down control signal is off, which turns transistor 26 off. Depending on which of transistors 22 and 24 is on, charge share line 21 is coupled to either bit line or bit line bar.

Figure 7:
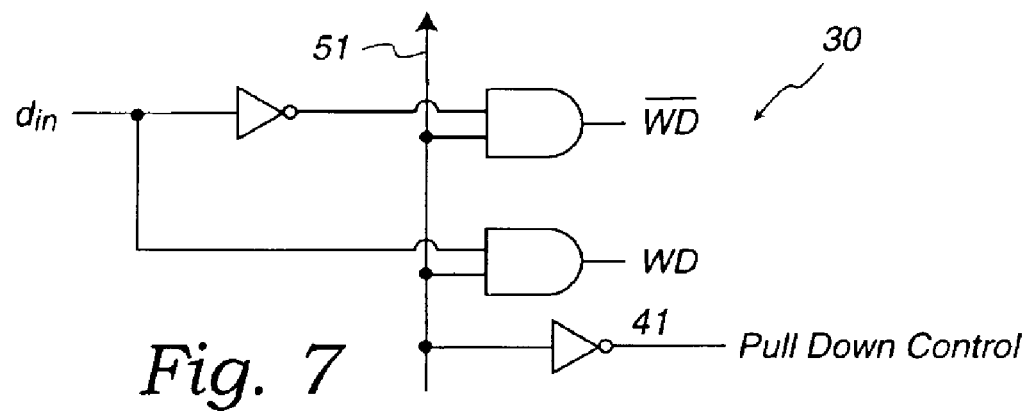
FIG. 7 is a block diagram of the write control circuit according to an embodiment of the present invention.

In FIG. 7, the output of write control circuit 30, WD and WD bar, are write data and write data bar respectively. The two input signals to circuit 30 are write clock 51 and $d_{in}$. When the write clock goes high, either write data or write data bar also goes high. This in turn turns on either charge sharing transistor 22 or charge sharing transistor 24. The pull down control signal also goes low by means of inverter 41. The pull down control signal is normally high, going to low and turning off transistor 40 during a write operation. When either charge sharing transistor 22 or 24 turns on, the charge on bit line or bit bar line will be shared with the charge on charge share line 21. As the voltage on charge share line 21 was initially low and the voltage on bit line and bit line bar was initially high, the charge on the lines will be distributed based upon the ratio of the capacitances of the two lines. When the charge share line capacitance and the bit line capacitances are roughly equal, the charge will be shared equally and the voltage difference divided in half. The voltage on the bit line and charge share line 21 will be equal at $\sim V_{dd}/2$.

Charge share line 21 provides the reference voltage to the memory cell illustrated in FIG. 5. The write margin of the memory cell is not affected as charge share transistors 22 and 24 (FIG. 6) insure that the voltage on the bit line that is being driven low and the charge share line are equal. In turn, the memory cell is written with new data. As the new low voltage on the bit line is $\sim V_{dd}/2$, the power consumed to precharge the line back to $V_{dd}$ is reduced by a factor of 4. Table 1 illustrates how this is defined and calculated for both the known art and the present invention.

TABLE 1

| $\Delta V = V_{dd}$ (Prior Art) | $\Delta V = V_{dd}/2$ (Present Invention) |
|---|---|
| C = bit line capacitance | C = bit line capacitance |
| f = bit line duty cycle | f = bit line duty cycle |
| Power (Prior Art) = $C\Delta V^2 f = CV_{dd}^2 f$ | Power (present Invention) = $C\Delta V^2 f = C(V_{dd}/2)^2 f = CV_{dd}^2 f/4$ |

Figure 8:
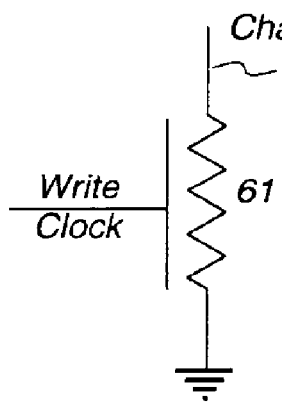
FIG. 8 illustrates a first clamping circuit according to the present invention.
Figure 9:
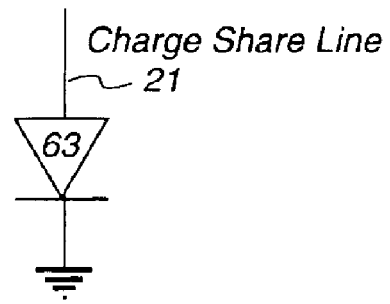
FIG. 9 shows another embodiment of the clamping circuit.

Write time is also reduced as the voltage on the charge share line increases. A clamping circuit can be used to change the amount of charge shared between the bit line and the charge share line. Such a clamping circuit is necessary to prevent the voltage on charge sharing line 21 from going too high. If the voltage on the charge sharing line is too high, data cannot be written to the core cell. FIG. 8 illustrates one type of clamp. The charge sharing clamp transistor 61 is preferably a highly resistive n-channel transistor used to drain part of the bit line charge to ground. FIG. 9 illustrates another embodiment of the clamping circuit. In this embodiment, diode 63 is coupled between the charge share line and ground. In this case, the voltage on the charge share line is limited to the forward turn-on voltage of diode 63.

What is claimed is:

1. A method for reducing power consumption in a random access memory, the method comprising the steps of:
    selecting a first memory cell in the random access memory to be written to;
    determining which of at least one bit line coupled to the selected first memory cell shall receive a first predetermined low value;
    coupling the bit line which will receive the low value to a charge share line, before writing the first predetermined low value; and
    decoupling the bit line from the charge share line before writing the first predetermined low value.

2. The method of claim 1 wherein the first predetermined low value comprises a logic low value.

3. The method of claim 1 wherein the at least one bit line further comprises a bit line and a bit line complement.

4. The method of claim 1 wherein the step of coupling reduces the total voltage swing on the bit line during the write operation, thereby reducing the power consumed during a write operation.

5. The method of claim 3 wherein the step of coupling reduces the total voltage swing on the bit line coupled to the charge share line during the write operation, reducing power consumption during a write operation.

6. In a random access memory comprised of a plurality of memory cells, each memory cell having a bit line and a complement bit line for reading and writing a binary value from and to the memory cell and a word line for addressing the memory cell, a charge share line which is coupled to one of the bit line and the bit line complement before the binary value is written to the memory cell, the charge share line reducing the voltage swing on the bit line which will receive the lower of the complementary binary values which are written to the memory cell.

7. In a random access memory comprised of a plurality of memory cells, each memory cell having a bit line and a complement bit line for reading and writing a binary value from and to the memory cell and a word line for addressing the memory cell, a charge share line which is coupled to one of the bit line and the bit line complement before the binary value is written to the memory cell, the charge share line reducing the voltage swing on the bit line which will receive the lower of the complementary binary values which are written to the memory cell, the charge share line further comprising a write control circuit, the write control circuit generating a first signal that couples the charge share line to the bit line and a second signal that couples the charge share line to the complement bit line.

8. The charge share line of claim 7 wherein a first n-channel transistor is coupled between the charge share line and the bit line and a second n-channel transistor is coupled between the charge share line and the complement bit line, one of the first and second n-channel transistors turning on when the write control circuit generates a first signal and the other n-channel transistor turning on when the write control circuit generates a second signal.

9. The charge share line of claim 8 wherein a third n-channel transistor is coupled to the charge share line and ground, the third n-channel transistor turning on when a third signal is generated by the write control circuit.

10. The charge share line of claim 9 wherein a voltage clamp is coupled between the third n-channel transistor and ground to limit the voltage rise across the third n-channel transistor and thereby reduce the voltage swing on one of the bit line and complement bit line when either is coupled to the charge share line.

11. The charge share line of claim 10 wherein the voltage clamp comprises a diode.

12. The charge share line of claim 10 wherein the voltage clamp comprises a high resistance n-channel transistor.

13. In a semiconductor memory wherein binary values are stored in a plurality of memory cells, a method for reducing power consumption in the memory comprised of the step of coupling a memory cell to a charge share line prior to driving a new binary value into the memory cell wherein the binary values are stored as complementary signals within the memory cell, the memory cell having a pair of bit lines and the charge share line being coupled to the bit line that is to receive the voltage signal having the lower voltage of the two complementary signals and wherein a write control circuit determines which of the pair of bit lines will be coupled to the charge share line.

14. A charge sharing circuit for reducing power consumption in a memory, the charge sharing circuit comprising:

a charge share line; and a write control circuit coupled to the charge share line and the memory, wherein the write control circuit generates three output signals, a first output signal coupling the charge share line to a bit line, a second signal coupling the charge share line to a complement bit line, and a third output signal coupling the charge share line to ground, only one of the first and second output signals being active at the same time.

15. The charge sharing circuit of claim 14 wherein the gates of three n-channel transistors are coupled to the first, second and third output signals respectively, the n-channel transistors turning on when they receive their respective signals, the first n-channel transistor coupling the bit line to the charge share line, the second n-channel transistor coupling the bit line complement to the charge share line and the third n-channel transistor coupling the charge share line to a ground voltage potential.

\* \* \* \* \*